(12) United States Patent
Korber, Jr.

(10) Patent No.: US 6,201,449 B1
(45) Date of Patent: Mar. 13, 2001

(54) FERROMAGNETIC TUNING RING FOR YIG OSCILLATORS

(75) Inventor: Marinus L. Korber, Jr., San Carlos, CA (US)

(73) Assignee: Stellex Microwave Systems, Inc., Palo Alto, CA (US)

( * ) Notice: Subject to any disclaimer, the term of this patent is extended or adjusted under 35 U.S.C. 154(b) by 0 days.

(21) Appl. No.: 09/360,807

(22) Filed: Jul. 24, 1999

(51) Int. Cl.[7] ............................. G01R 23/00; H03B 5/18; H01P 7/00
(52) U.S. Cl. ............................ 331/44; 331/68; 331/96; 331/108 R; 331/108 D; 331/175; 331/179; 333/219; 333/235
(58) Field of Search ................................. 331/44, 68, 96, 331/108 R, 117 R, 117 FE, 117 D, 108 D, 175, 179, 187; 333/219, 235

(56) References Cited

U.S. PATENT DOCUMENTS

| 769,896 | 8/1985 | Ito et al. ............................. 333/202 |
|---|---|---|
| 835,949 | 4/1997 | Ataiiyan et al. .................. 333/219.2 |
| 4,340,861 | * 7/1982 | Sparks ................................... 324/205 |
| 4,701,729 | * 10/1987 | Ito et al. .............................. 333/219 |
| 4,704,739 | * 11/1987 | Murakami et al. ................... 455/325 |
| 4,887,052 | * 12/1989 | Murakami et al. ..................... 331/96 |
| 5,517,161 | * 5/1996 | Andersson et al. ................. 333/202 |
| 5,677,652 | * 10/1997 | Parrott ............................... 333/219.2 |
| 5,801,591 | * 9/1998 | Parrott ................................... 331/96 |

* cited by examiner

*Primary Examiner*—David Mis
(74) *Attorney, Agent, or Firm*—Mikio Ishimaru (57) ABSTRACT

A YIG oscillator is provided having a YIG sphere magnetically coupled to a permanent magnet, a field straightener, and a ferromagnetic ring. The field straightener is attached to the permanent magnet and has a predetermined circumference. The ferromagnetic ring is configured to fit around the predetermined circumference of the field straightener. The ferromagnetic ring fine-tunes the magnetic field combination of the permanent magnetic and the field straightener. A coupling loop is configured to transceive resonance signals to and from the YIG sphere.

21 Claims, 5 Drawing Sheets

FERROMAGNETIC TUNING RING FOR YIG OSCILLATORS

TECHNICAL FIELD

The present invention relates generally to oscillators for electronic applications, and more particularly to tunable YIG oscillators with a ferromagnetic tuning ring.

BACKGROUND ART

A tunable YIG (Yttrium-Iron-Garnet) oscillator is an oscillator that generates signals in the microwave band from 500 MHz up to 40 GHz. The heart of the YIG oscillator is a YIG spherical resonator. A YIG spherical resonator has a natural resonant frequency that is proportional to the strength of the magnetic field going through the YIG spherical resonator. YIG resonators resonate when a magnetic field is applied to a YIG ($Y_3Fe_5O_{12}$) sphere. The output frequency of a YIG oscillator is a function of the magnetic field strength that is supplied to the YIG sphere by an associated permanent magnet.

YIG oscillators appeal to customers because they generate an output signal that is very clean. A YIG oscillator that is specified to have an output frequency of 5 GHz will output a frequency of 5 GHz with very little deviation. YIG oscillators are stable and have little jitter. They have little phase noise, which is a measure of spectral purity. An oscillator which is not spectrally clean, or which has a lot of jitter is going to have trouble if another signal is placed close to the oscillator signal. If the oscillator signal has a lot of noise, it will smear into another signal that is of importance. Noisy oscillators force designers to space other oscillators further away. In the telecommunications world, bandwidth is imperative, and there are only certain bands allocated for certain microwave radios. If an oscillator has a lot of jitter and a lot of phase noise, then the oscillator is going to interfere with another oscillator with a signal operating in a nearby band.

Oscillators have important applications in cellular telephones. As the cellular telephone community expands, the applications for YIG oscillators will continue to increase. Cellular telephones require base stations to receive, amplify, and transmit communications signals. The base station receiver is basically a radio receiver that has to have a local oscillator. This local oscillator has to be a very clean, low-phase noise, local oscillator.

Another oscillator called a dielectric resonator oscillator competes with the YIG oscillator. The dielectric resonator oscillator is also a very low phase noise oscillator. The difference between the dielectric resonator oscillator and the YIG oscillator is that the YIG oscillator is tunable which enables the frequency of the YIG oscillator to be changed.

For example, if a company is building a base station transceiver, it is allocated a certain frequency or band of frequencies. If the company buys an oscillator that has to be set at 5 GHz, the company can either buy a YIG oscillator or a dielectric resonator oscillator. If the FCC reallocates frequencies or some other change, the company can no longer use the local oscillator at 5 GHz. With the dielectric resonator oscillator, a technician would have to physically go into the radio; i.e. physically remove the dielectric resonator oscillator and purchase a totally different dielectric resonator oscillator and then make sure everything worked. So there is the cost of the technician doing the work which is expensive. Moreover, the company would have to stock all kinds of dielectric resonator oscillators that have different oscillating frequencies because the frequencies may change again.

YIG oscillators on the other hand, unlike the dielectric resonator oscillators, are tunable or frequency agile. Supplying a little current to the oscillator enables the frequency of the oscillator to shift from 4 GHz to 6 GHz or any frequency in between. Referring to the base station transceiver example, a simple software manipulation can complete the frequency transformation for the company. The software manipulation does not even necessarily have to take place at the base station. It can be accomplished remotely.

A single YIG oscillator could replace as many as 50 dielectric resonator oscillators that a customer might have to stock because the customer does not know what frequency may be required in the future.

The output frequency of a YIG oscillator is a function of the magnetic strength of the permanent magnet. To precisely set the resonant frequency of YIG oscillators, accurately specified permanent magnets are needed. However, permanent magnets of accurate specification are not readily available. For example, to buy a permanent magnet that generates a 3,000 gauss airgap field from a manufacturer, in reality what would happen is the manufacturer would supply a permanent magnet that generated a magnetic field strength anywhere from 2700 gauss to 3300 gauss. A ten-percent error in the magnetic field specification is not uncommon.

If it were possible to buy precision magnets, manufacturing the YIG oscillator would be simple. The problem is that manufacturers do not supply magnets that are sufficiently precise. The impreciseness of the magnetic field also affects the phase noise. The reason that the YIG oscillator has really excellent phase noise is due to the 'quality' factor of the YIG resonator. The YIG resonator has a very high 'quality' factor, or Q. When the Q is distorted or lowered it is very undesirable. Thus, a higher Q provides better phase noise in the YIG oscillator. Thus, maintaining a high Q is important.

Further, because of the way permanent magnets are manufactured, permanent magnets do not generate a homogenous magnetic field. Accordingly, such permanent magnets will have uneven magnetic fields at the YIG sphere. The uneven magnetic field affects the Q factor of the YIG sphere such that different parts of the YIG sphere oscillate at slightly different frequencies. Thus, the YIG oscillator, instead of generating a nice clean signal, generates a fuzzy signal because the YIG resonator is not oscillating at one frequency. The frequency of the YIG oscillator becomes smeared.

To make the magnetic field homogeneous, a disc of ferromagnetic material is placed on the face of the permanent magnet. The ferromagnetic material smoothes the unevenness and focuses the magnetic field. The ferromagnetic material is called a "field straightener", because the ferromagnetic material straightens the uneven magnetic field from the permanent magnet.

A beneficial attribute of the field straightener is that it not only straightens the magnetic field, but the diameter of the field straightener affects the magnetic field strength at the YIG sphere. With a permanent magnet most of the magnetic field goes through the YIG sphere; however, some of the magnetic field goes around the side and back to the opposite pole of the permanent magnet. The field straightener affects how much of the magnetic field reaches the YIG sphere and how much gets shunted away. By varying the diameter of field straighteners, the magnetic field strength can be changed. Increasing the diameter of the field straightener, lower the affects of the magnetic field on the YIG sphere.

The field straighteners precisely set the magnetic field that affects the YIG sphere. It is important that the field straightener be concentric with the permanent magnet to avoid altering the magnetic field and adversely affecting the oscillating frequency of the YIG sphere.

One of the major manufacturing challenges has been to properly align the field straightener to the permanent magnet so that the field straightener can be epoxied in the correct location to the permanent magnet. Many different fixtures are used to handle different sized field straighteners adding to the cost and complexity of manufacturing YIG oscillators.

As the number of YIG oscillators required by customers increases, it becomes more desirable to develop apparatus and manufacturing methods for making YIG oscillators more efficiently and less expensively.

DISCLOSURE OF THE INVENTION

The present invention provides a tunable YIG oscillator having a YIG sphere magnetically coupled to a permanent magnet, a field straightener, and a ferromagnetic ring. The field straightener is attached to the permanent magnet and has a predetermined circumference. The ferromagnetic ring is configured to fit around the predetermined circumference of the field straightener. The ferromagnetic ring fine-tunes the magnetic field combination of the permanent magnet and the field straightener. A coupling loop is configured to transceive resonance signals to and from the YIG sphere.

The present invention further provides a reduction in the number of different sized field straighteners which were stocked during the manufacturing of YIG oscillators.

The present invention further provides for the elimination of different fixtures which were needed to epoxy the different sized field straighteners to the permanent magnet.

The present invention further provides easy calibration of the YIG oscillator which does not require different diameter field straighteners.

The present invention further provides a reduction in the cost of manufacturing the YIG oscillators.

The present invention further provides a reduction in the time to manufacture the YIG oscillator which avoids hold ups in production while waiting for the field straightener epoxy to cure.

The present invention further provides for ease of final assembly of the YIG oscillator.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 A (PRIOR ART) is a prior art YIG resonator;

FIG. 1B (PRIOR ART) is a prior art YIG oscillator;

BEST MODE FOR CARRYING OUT THE INVENTION

Figures 1A, 1B:
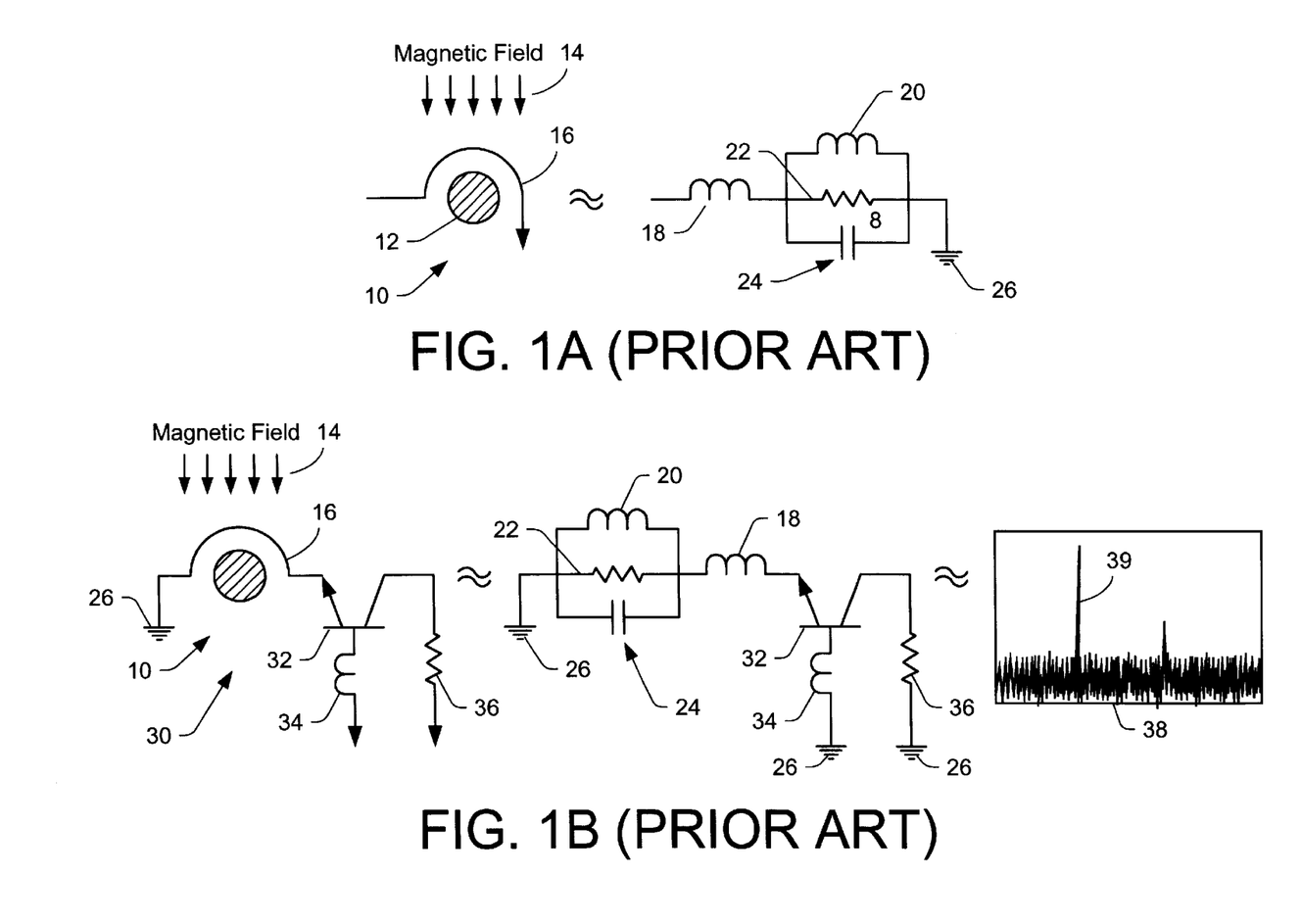

Referring now to FIG. 1A (PRIOR ART), therein is shown a YIG resonator 10 including a YIG sphere 12, a magnetic field 14, and a YIG coupling loop 16. The coupling loop 16 is a wire that wraps around the YIG sphere 12. The YIG resonator 10 is a magnetic resonance device that has a resonant frequency which is a function of the magnetic field strength in which the YIG resonator is immersed. For example, if the magnetic field strength is such that the resonator resonant frequency is 5 GHz, signals very close to 5 GHz couple to the resonator. Other signals not within 5 GHz do not couple with the resonator. Once signals couple to the YIG resonator 10, the YIG resonator 10 re-radiates the signal back out onto the coupling loop 16. Depending on the design of the YIG resonator 10, there may be one loop or two loops to suit many kinds of microwave devices, e.g. microwave filters, microwave discriminators, and microwave oscillators. An equivalent circuit of the YIG resonator 10 includes an inductor 18, which represents the actual inductance of the coupling loop 16 and intrinsic inductor 20, intrinsic resistance 22, and intrinsic capacitance 24. The intrinsic inductor 20, the intrinsic resistance 22, and the intrinsic capacitance 24 are coupled in parallel and represent intrinsic electrical components of the YIG sphere 12. The intrinsic electrical components of the YIG sphere 12 are connected to a ground 26.

Referring now to FIG. 1B (PRIOR ART), therein is shown a YIG oscillator 30. Elements which are the same as for the YIG resonator 10 have the same numbers. The YIG oscillator 30 is similar to having the YIG resonator 10 coupled to a transistor 32. In order for the YIG resonator 10 to function as an oscillator, the emitter of transistor 32 supplies an active signal to the coupling loop 16 of the YIG resonator 10. The other end of the coupling loop 16 is coupled to ground 26. An inductor 34 is coupled to the base of transistor 32 and ground 26. The inductor 34 connected to the base of transistor 32 causes the transistor 32 in conjunction with YIG resonator 10 to oscillate. Resistor load 36 connected to the collector of transistor 32 and ground 26 provides a load for the oscillator 30. An equivalent circuit of the oscillator 30 includes the equivalent YIG resonator 10 having the intrinsic inductor 20, intrinsic resistance 22, and intrinsic capacitance 24 coupled in parallel and the inductor 18 coupled to the emitter of transistor 32. The other end of the coupling loop 16 is coupled to ground 26. The inductor 34 is connected to the base of transistor 32 and ground 26. The resistor load 36 is connected to the collector of transistor 32 and ground 26.

During operation of the oscillator 30, a sinusoid signal, for example, at the emitter of transistor 32 excites the YIG resonator 10 via the inductor 18. At resonance, the inductive reactance and the capacitive reactance of the YIG resonator 10 cancel because they are equal in magnitude but opposite in phase. The resulting signal at resonance provides a highly reflective signal that reflects back to the transistor 32. Referring to an oscilloscope output 38 of the resistor load 36, a spike 39 signifies the output of the oscillator 30. Until the resonator frequency of the YIG resonator 10 is matched, the transistor 32 generates noise which the oscilloscope output 38 shows as random low amplitude signals. However, when outputs of the transistor 32 match the resonate frequency of the YIG resonator 10, the signal bounces back from the YIG resonator 10 to the transistor 32 which, in turn, amplifies the signal and sends it back to the YIG resonator 10. This latter signal is of higher amplitude than the previous signal from the transistor 32. As the latter signal reaches the YIG resonator 10 and bounces back, it is again amplified and sent back to the YIG resonator 10. The cycle repeats again and again. The result is an oscillator 30 which operates at a predetermined oscillation frequency.

Figure 2A:
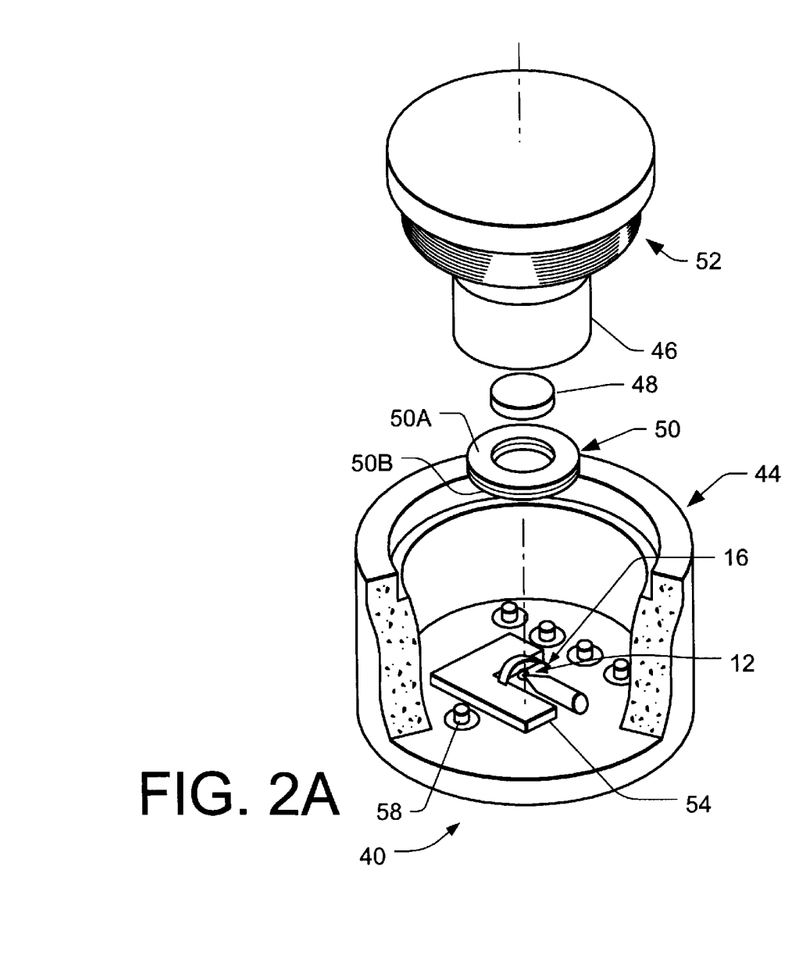
FIG. 2A is a YIG oscillator according to the present invention in a top view isometric illustration.
Figure 2B:
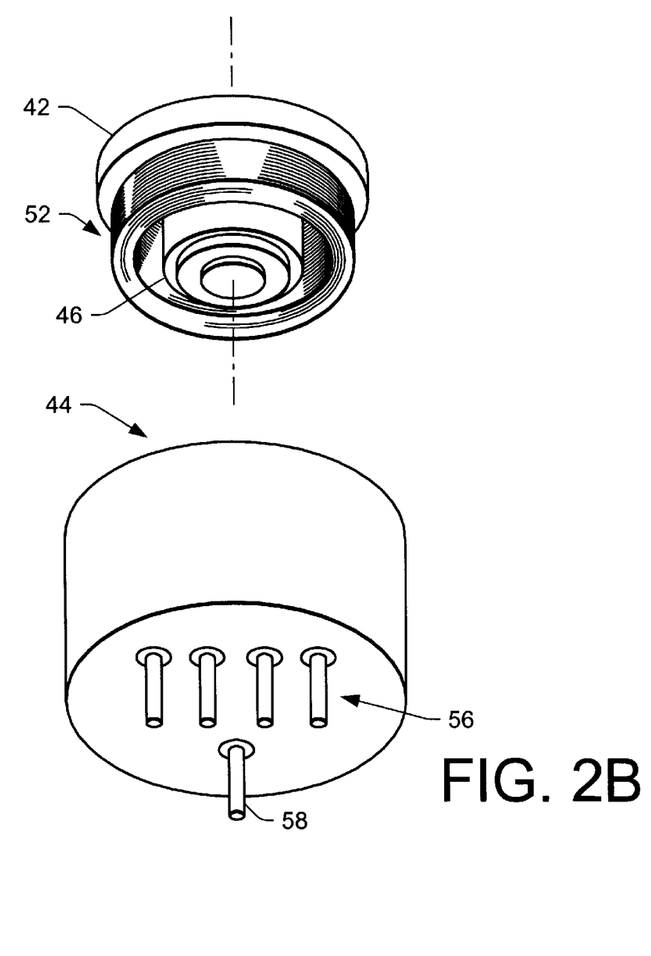
FIG. 2B is a YIG oscillator according to the present invention in a bottom view.

Referring now to FIGS. 2A and 2B, therein are shown a YIG oscillator 40 according to the present invention in respective top and bottom view isometric illustration. The YIG oscillator 40 includes a top housing 42 and a bottom housing 44. The top housing 42 includes a permanent magnet 46, a field straightener 48, ferromagnetic rings 50, and a tuning coil 52. The ferromagnetic rings 50 have an inside diameter slightly larger than the outside diameter of the field straightener 48 and have an outside diameter approximately the diameter of the permanent magnet 46. Two representative ferromagnetic rings 50A and 50B are shown as part of the ferromagnetic rings 50, but it will be understood that a plurality of rings of varying thickness could be part of the ferromagnetic rings 50.

The same elements as in FIG. 1 (PRIOR ART) have the same numbers in other figures. Thus, the bottom housing 44 includes the YIG sphere 12, the coupling loop 16, and a substrate 54. Input/output pins 56 and an RF output pin 58 pass through the bottom housing 44. The permanent magnet 46 attaches to an underside of the top housing 42. Attached to the permanent magnet 46 are the field straightener 48 and the ferromagnetic rings 50. The combination of the permanent magnet 46, the field straightener 48, and the ferromagnetic rings 50 alters the magnetic field 14 to set the resonate frequency of the YIG oscillator 40.

The tuning coil 52 provides frequency agility to the oscillator 40. Supplying current to the tuning coil 52 allows the magnetic field 14 to be reduced or increased thereby lowering the oscillator frequency or raising the oscillator frequency of the YIG oscillator 40, respectively. The YIG sphere 12, the coupling loop 16, and the substrate 54 attaches to the bottom housing 44. The substrate 54 includes individual circuit components other than the YIG sphere 12 for the YIG oscillator 40. The circuit components include the transistor 32. The coupling loop 16 may be a ribbon wire or a wire loop. The coupling loop 16 couples energy from the transistor 32 into the YIG sphere 12. The top housing 42 and the bottom housing 44 support the permanent magnet and enclose the internal components.

According to the present invention, the top housing 42 and the bottom housing 44 are made from a ferromagnetic nickel iron alloy also known as carpenter 49 material. The carpenter 49 material serves as a guide to the magnetic flux around the housing of the YIG oscillator 40 and through the YIG sphere 12 and also provides a shield to the YIG resonator 10 from external dc and ac magnetic fields external to the YIG oscillator 40. A source of external dc and ac magnetic fields includes components such as power supply transformers that, if unshielded, do alter or modulate the YIG resonator 10 frequency.

The resonant frequency of the YIG sphere 12 is a function of the magnetic field strength. The higher the magnetic field 14, the higher the resonant frequency of the YIG sphere 12 and the higher the output frequency of the YIG oscillator 40. However, in practice the permanent magnetic 46 provides an uneven magnetic field. To straighten the uneven magnetic field, the field straightener 48 focuses the magnetic field 14 to make the magnetic field 14 smooth at the YIG sphere 12. If the magnetic field 14 is not flat, different areas of the YIG resonator 10 oscillate at different frequencies causing poor phase noise and cause the YIG oscillator 40 to be unusable.

According to the present invention, the ferromagnetic rings 50 fit around the field straightener 48 to actively set the magnetic field strength of the combined permanent magnet 46 and field straightener 48.

Figure 3:
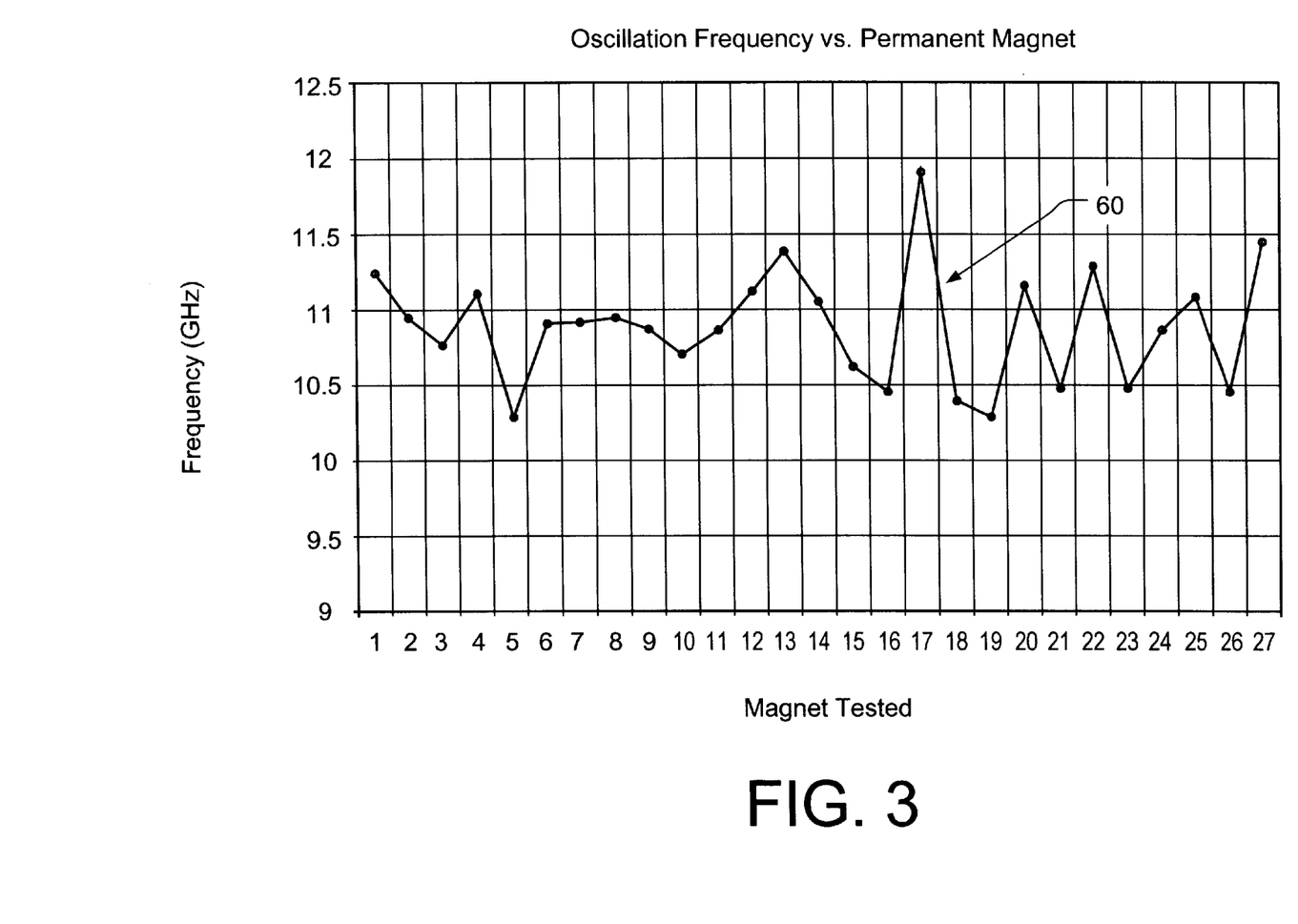
FIG. 3 (PRIOR ART) shows a graph of magnet strength from a received lot of different permanent magnets.

Referring now to FIG. 3 (PRIOR ART), therein is shown a graph 60 of magnet strengths from a received lot of different permanent magnets. In selecting permanent magnets, manufacturers of permanent magnets typically publish an energy product. If a particular energy product produces an oscillator that oscillates at a desired frequency, the actual permanent magnets received from the manufacturer have as much as +/−10% error in the actual energy product, as indicated by the graph. The bottom axis represents 27 different magnets and the vertical axis represents the frequency of the YIG resonator 10 for each different magnet. FIG. 3 (PRIOR ART) indicates that the disparity between different permanent magnets have profound effects on the resonant frequency of the YIG resonator 10.

Figure 4:
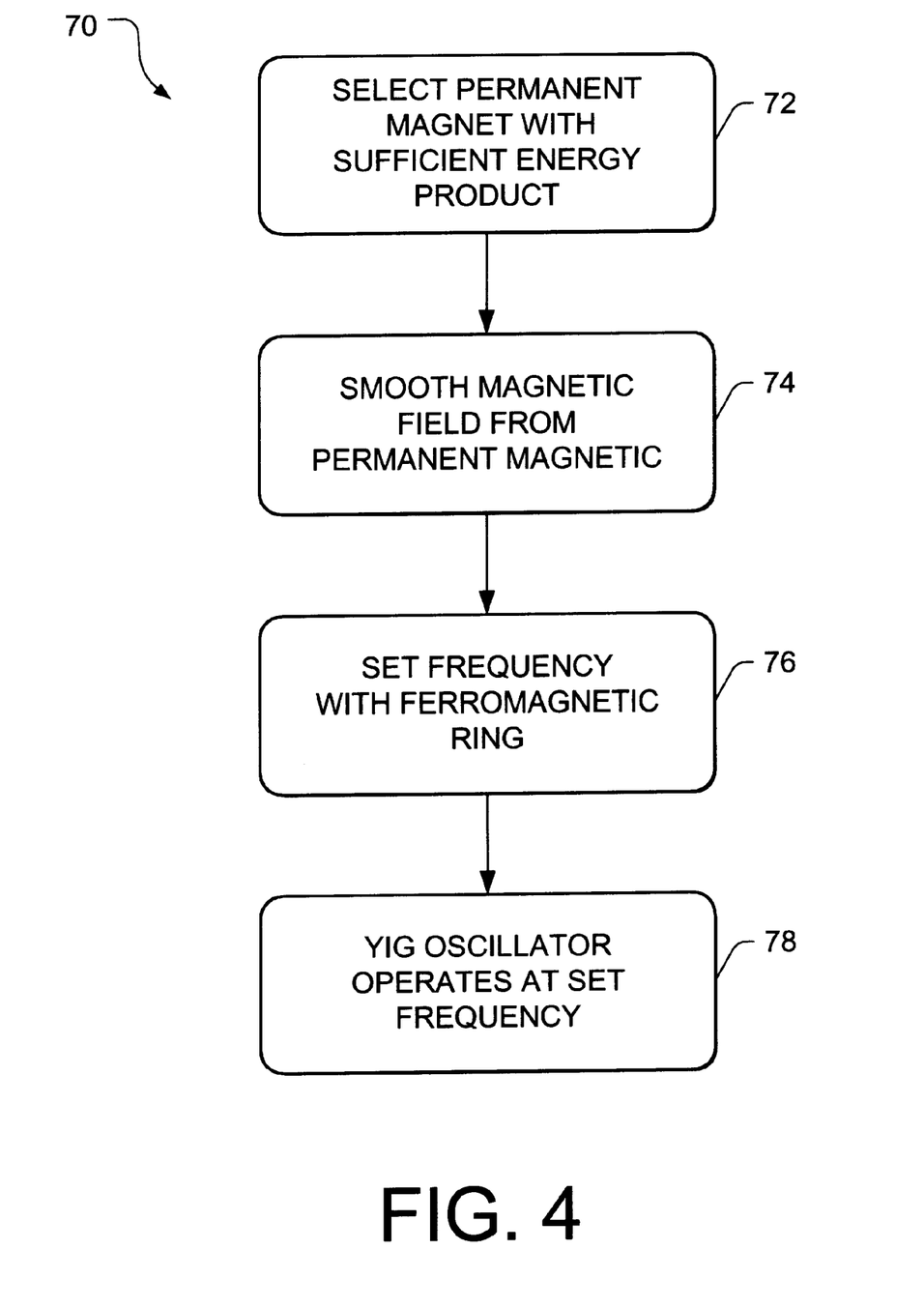
FIG. 4 shows a flow diagram of setting an oscillating frequency of a YIG oscillator in accordance to the present invention.

Referring now to FIG. 4, therein is shown a flow diagram 70 of setting an oscillating frequency of a YIG oscillator 40. The flow diagram begins with step 72 where a permanent magnet 46 having the proper energy product is initially selected. In step 74, a field straightener 48 is attached to the permanent magnet 46 to smooth the unevenness of the magnetic field 14 inherent with manufactured permanent magnets. The diameter of the field straightener 48 is predetermined and is the standard used for pre-setting the particular oscillating frequency of the YIG oscillator. The combination of the permanent magnet 46 and the field straightener 48 provides a stronger magnetic field than is needed. Thus, the YIG oscillator 40 oscillates at a higher frequency than the desired frequency. Step 76 sets the oscillating frequency by adding ferromagnetic rings 50 to reduce the magnetic field combination of the permanent magnet 46 and the field straightener 48. The flow diagram ends in step 78 where the YIG oscillator 40 oscillates at the set frequency.

If no ferromagnetic rings 50 are attached to the permanent magnet 46, the magnetic field 14 is at the highest field strength. An addition of a ferromagnetic ring 50A reduces the magnetic field 14. The thicker the ferromagnetic rings 50, the more the magnetic field 14 is shunted away from the YIG sphere 12 causing the YIG resonator 10 to oscillate at lower frequencies. Stacking the ferromagnetic rings 50A and 50B together increases the thickness and the effect on the magnetic field 14. For example, a plurality of 5 mil thick ferromagnetic rings 50A, 50B, etc. equate to the ferromagnetic rings 50 being 5 mils, 10 mils, 15 mils, 20 mils, etc. thick. With the addition of 3 mil thick ferromagnetic rings (not shown), additional combinations are possible. Because the ferromagnetic rings 50A, 50B, etc. are inexpensive, other thickness rings are inventoried for even more combinations.

In practice, a technician on the production line applies a voltage to the pre-assembled oscillator, having the field straightener 48 attached to the permanent magnetic 46, and looks at the output frequency on a frequency counter. Initially the pre-assembled oscillator is set up so the output frequency will always be too high. For example, if the technician is trying to build an 8 GHz oscillator, maybe the pre-assembled oscillator oscillates at 9 GHz, or maybe it oscillates at 8.5 GHz or 9.5 GHz. Inherently, there is a wide variance in magnetic strength of manufactured permanent magnets. The technician attaches a ferromagnetic ring 50A and checks the oscillating frequency. If it is too high, the technician increases the number or thickness of the ferromagnetic ring 50A and so on to set the oscillating frequency at 8 GHz. The ferromagnetic rings 50 are easily positioned around the field straightener because the outside diameter of the field straightener and the inside diameter of the ring are about the same.

According to another embodiment of the present invention, the ferromagnetic ring 50A is snipped to alter the magnetic field 14. By cutting part of the ferromagnetic ring 50A, technicians have even more latitude in tuning the YIG oscillator 40. The unevenness of a snipped ferromagnetic ring 50A causes the magnetic field 14 to be skewed; however, tests have shown that the minor field skewing caused by snipping away part of the ferromagnetic ring 50A has no adverse effect on the phase noise.

By using the ferromagnetic rings 50 to set the magnetic field 14, there is no longer a need to stock a plurality of field straighteners 24 to set the magnetic field 14. The field straighteners 24 are more expensive than the ferromagnetic rings 25. In practice, only one size of the field straightener 48 is stocked, which increases the efficiency of producing YIG oscillators 20. The top housing 42 including the permanent magnet 46 and field straightener 48 is pre-assembled and stocked, which enables quick response time to customer orders of YIG oscillators. Positioning of the field straightener 48 requires a fixture to center the field straightener 48 with the permanent magnet 46. Thus, by already having the field straightener 48 epoxied to the permanent magnet 46, a technician epoxies the ferromagnetic rings 50 onto the permanent magnet 46 without a need for a fixture because the ferromagnetic rings 50 have an inside diameter only slightly larger than the diameter of the field straightener 48, and the permanent magnet 46 attracts the ferromagnetic rings 50.

Figure 5:
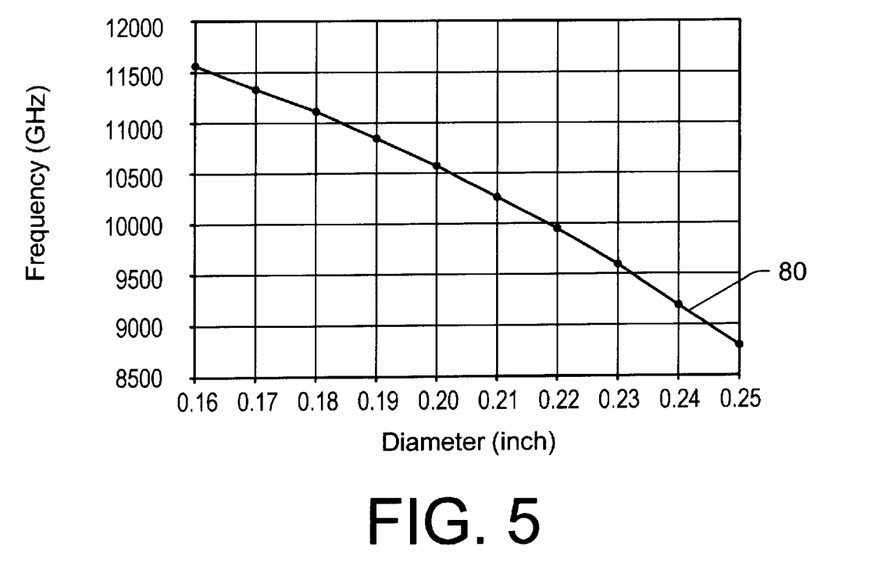
FIG. 5 shows a graph of the resonant frequency as a function of field straightener diameter.

FIG. 5 shows a graph 80 of the resonant frequency as a function of the field straightener diameter. The vertical axis represents the resonant frequency and the horizontal axis represents the field straightener diameter. As the diameter of the field straightener increases, the frequency of the YIG oscillator decreases. Thus, the diameter of the field straightener is inversely proportional to the magnetic field 14.

Figure 6:
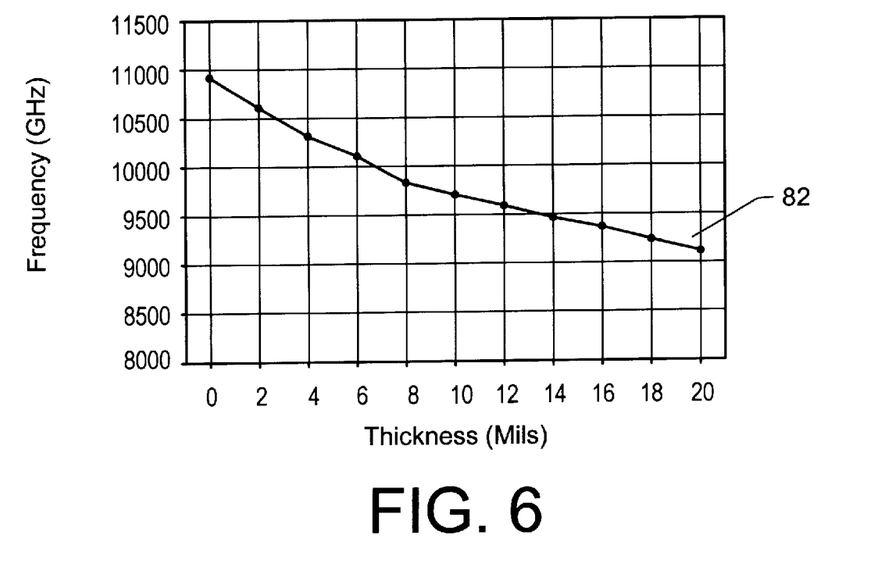
FIG. 6 shows a graph of the resonant frequency as a function of ferromagnetic ring thickness.

FIG. 6 shows a graph 82 of the resonant frequency as a function of the ferromagnetic ring thickness. The vertical axis represents the resonant frequency and the horizontal axis represents the thickness of the ferromagnetic ring from zero thickness to a 20 mil thick ring. As the ferromagnetic ring thickness increases, the frequency of the YIG oscillator decreases. Thus, the thickness of the ferromagnetic is inversely proportional to the magnetic field 14.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A YIG resonator comprising:
a permanent magnet, the permanent magnet having a first surface;
a field straightener having a predetermined perimeter, the field straightener attached to the first surface of the permanent magnet;
a ferromagnetic ring configured to fit around the predetermined perimeter of the field straightener, the ferromagnetic ring attached to the first surface of the permanent magnet;
a YIG sphere magnetically coupled to the permanent magnet, the field straightener, and the ferromagnetic ring; and
a coupling loop configured to transceive resonance signals to and from the YIG sphere.

2. The YIG resonator as claimed in claim 1 wherein:
the coupling loop passes through a magnetic field between the YIG sphere and the permanent magnet, the field straightener, and the ferromagnetic ring.

3. The YIG resonator as claimed in claim I including:
a tuning coil attached to the permanent magnet configured to electrically alter magnetic coupling between the YIG sphere and the permanent magnet, the field straightener, and the ferromagnetic ring.

4. The YIG resonator as claimed in claim 1 wherein:
the permanent magnet has a cylindrical perimeter and the field straightener is a ferromagnetic disc having a smaller diameter than the permanent magnet.

5. The YIG resonator as claimed in claim 4 wherein:
the field straightener is concentric with the permanent magnet.

6. The YIG resonator as claimed in claim 1 wherein:
the field straightener is epoxied to the permanent magnet.

7. The YIG resonator as claimed in claim I wherein:
the ferromagnetic ring is epoxied to the permanent magnet.

8. A YIG oscillator having a YIG enclosure including a top housing and a bottom housing, the YIG oscillator comprising:
a permanent magnet having a first surface, the permanent magnet attached to the top housing of the YIG enclosure opposite the first surface;
a field straightener having a predetermined circumference attached to the first surface of the permanent magnet;
a ferromagnetic ring configured to fit around the predetermined circumference of the field straightener, the ferromagnetic ring attached to the first surface of the permanent magnet;
a YIG sphere in the bottom housing of the YIG enclosure configured to magnetically couple to the permanent magnet, the field straightener, and the ferromagnetic ring;
a substrate connected to the bottom housing of the YIG enclosure adjacent the YIG sphere; and
a coupling loop connected to the substrate configured to loop over the YIG sphere and pass through a magnetic field between the YIG sphere and the permanent magnet, the field straightener, and the ferromagnetic ring.

9. The YIG oscillator as claimed in claim 8 including:
a transistor formed on the substrate connected to the coupling loop configured to excite the magnetic field between the YIG sphere and the permanent magnet, the field straightener, and the ferromagnetic ring.

10. The YIG oscillator as claimed in claim 8 including:
a tuning coil attached to the top housing configured to electrically alter magnetic field generated by the permanent magnet, the field straightener, and the ferromagnetic ring.

11. The YIG oscillator as claimed in claim 10 wherein:
the tuning coil is capable of having current passing through to increase and decrease the magnetic field generated by the permanent magnet, the field straightener, and the ferromagnetic ring.

12. The YIG oscillator as claimed in claim 8 wherein:

the permanent magnet is a cylindrical permanent magnet; and the field straightener is a cylindrical ferromagnetic disc.

13. The YIG oscillator as claimed in claim 12 wherein:

the cylindrical ferromagnetic disc is concentric with the cylindrical permanent magnet.

14. A method of tuning a YIG oscillator having a YIG enclosure including a top housing and a bottom housing wherein a YIG sphere is attached to the bottom housing, the method comprising the steps:

attaching a cylindrical permanent magnet to the top housing;

epoxing a cylindrical field straightener having a predetermined circumference to the cylindrical permanent magnet;

selecting a ferromagnetic ring having a predetermined thickness configured to fit around the predetermined circumference of the cylindrical field straightener to tune the YIG oscillator; and epoxing the ferromagnetic ring to the cylindrical field straightener.

15. The method of tuning a YIG oscillator as claimed in claim 14 wherein the step of:

epoxing a cylindrical field straightener further includes the step of centering the cylindrical field straightener with the cylindrical permanent magnet.

16. The method of tuning a YIG oscillator as claimed in claim 14 wherein the step of:

selecting a ferromagnetic ring includes the step of attaching a plurality of ferromagnetic rings together.

17. The method of tuning a YIG oscillator as claimed in claim 14 wherein the step of:

selecting a ferromagnetic ring includes the step of snipping a portion of the ferromagnetic ring.

18. A YIG resonator comprising:

a permanent magnet;

a field straightener having a predetermined perimeter, said field straightener attached to the permanent magnet;

a ferromagnetic ring configured to fit around the predetermined perimeter of the field straightener;

a YIG sphere magnetically coupled to the permanent magnet, the field straightener, and the ferromagnetic ring; and a coupling loop configured to transceive resonance signals to and from the YIG sphere;

wherein the ferromagnetic ring includes a plurality of ferromagnetic rings whereby the YIG resonator can be fine-tuned to a predetermined resonant frequency.

19. A YIG resonator comprising:

a permanent magnet;

a field straightener having a predetermined perimeter, said field straightener attached to the permanent magnet;

a ferromagnetic ring configured to fit around the predetermined perimeter of the field straightener;

a YIG sphere magnetically coupled to the permanent magnet, the field straightener, and the ferromagnetic ring; and a coupling loop configured to transceive resonance signals to and from the YIG sphere;

wherein the ferromagnetic ring includes a portion removed whereby the YIG resonator can be fine-tuned to a predetermined resonant frequency.

20. A YIG oscillator having a YIG enclosure including a top housing and a bottom housing, the YIG oscillator comprising:

a permanent magnet attached to the top housing of the YIG enclosure;

a field straightener having a predetermined circumference attached to the permanent magnet;

a ferromagnetic ring configured to fit around the predetermined circumference of the field straightener;

a YIG sphere in the bottom housing of the YIG enclosure configured to magnetically couple to the permanent magnet, the field straightener, and the ferromagnetic ring;

a substrate connected to the bottom housing of the YIG enclosure adjacent the YIG sphere; and a coupling loop connected to the substrate configured to loop over the YIG sphere and pass through a magnetic field between the YIG sphere and the permanent magnet, the field straightener, and the ferromagnetic ring;

wherein the ferromagnetic ring includes a plurality of ferromagnetic rings whereby the YIG oscillator can be fine-tuned to a predetermined resonant frequency.

21. A YIG oscillator having a YIG enclosure including a top housing and a bottom housing, the YIG oscillator comprising:

a permanent magnet attached to the top housing of the YIG enclosure;

a field straightener having a predetermined circumference attached to the permanent magnet;

a ferromagnetic ring configured to fit around the predetermined circumference of the field straightener;

a YIG sphere in the bottom housing of the YIG enclosure configured to magnetically couple to the permanent magnet, the field straightener, and the ferromagnetic ring;

a substrate connected to the bottom housing of the YIG enclosure adjacent the YIG sphere; and a coupling loop connected to the substrate configured to loop over the YIG sphere and pass through a magnetic field between the YIG sphere and the permanent magnet, the field straightener, and the ferromagnetic ring;

wherein the ferromagnetic ring includes a portion removed whereby the YIG resonator can be fine-tuned to a predetermined resonant frequency.

* * * * *

UNITED STATES PATENT AND TRADEMARK OFFICE
CERTIFICATE OF CORRECTION

PATENT NO.    : 6,201,449 B1
DATED         : March 13, 2001
INVENTOR(S)   : Marinus L. Korber, Jr.

It is certified that error appears in the above-identified patent and that said Letters Patent is hereby corrected as shown below:

<u>Title page,</u>
Item [56] References Cited, replace "769,896 8/1985 Ito et al. ........................333/202"
        "835,949 4/1997 Ataiiyan et al. ................333/219.2"

with -- 4,636,756 1/1987 Ito et al. ................333/202 --
-- 5,793,268 8/1998 Ataiiyan et al. ............333/219.2 --

Signed and Sealed this

Sixth Day of November, 2001

Attest:

*Nicholas P. Godici*

NICHOLAS P. GODICI
*Attesting Officer*    *Acting Director of the United States Patent and Trademark Office*